(12) United States Patent
Coles et al.

(10) Patent No.: US 6,694,024 B2
(45) Date of Patent: Feb. 17, 2004

(54) TRANSMITTING DATA WORDS (75) Inventors: Alistair Neil Coles, Bath (GB); Eric Henri Ulysse Deliot, Bristol (GB)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/266,907

(22) Filed: Oct. 7, 2002

(65) Prior Publication Data

US 2003/0081782 A1 May 1, 2003

Related U.S. Application Data (63) Continuation of application No. 09/263,633, filed on Mar. 5, 1999.

(51) Int. Cl.$^7$ ................................. G06F 1/24
(52) U.S. Cl. ..................... 380/260; 380/28; 380/37; 380/42
(58) Field of Search ................ 380/260, 37, 42, 380/28

(56) References Cited

U.S. PATENT DOCUMENTS

| | | |
|---|---|---|
| 4,215,366 A | 7/1980 | Davidson |
| 5,280,500 A | 1/1994 | Mazzola et al. |
| 5,426,699 A | 6/1995 | Wunderlich et al. |
| 5,438,571 A | 8/1995 | Albrecht et al. |
| 5,535,275 A | 7/1996 | Sugisaki et al. |

FOREIGN PATENT DOCUMENTS

| | | |
|---|---|---|
| EP | 367093 | 10/1989 |
| EP | 584865 | 8/1993 |
| WO | WO 92/09162 | 5/1992 |
| WO | WO 92/22160 | 12/1992 |

OTHER PUBLICATIONS

International Search Report, Jul. 7, 1997, PCT/GB97/00666.

IEEE Proceedings–I, vol. 138, No. 3, Jun. 1991, J.K. Pollard, "Multilevel Data Communication Over Optical Fibre".

*Primary Examiner*—Thomas R. Peeso (57) ABSTRACT

Codeword synchronization and scrambler synchronization in a block-coded serial communications link are accomplished by (i) substituting a specific comma control codeword for a selected codeword value occurring in the output of a scrambler receiving an input data stream, and (ii) using selected polarity-independent bits of the block-coded scrambled bit stream to convey samples of the scrambler state. Inversion of received control codewords indicates polarity inversion somewhere along the link, enabling automatic polarity correction to be applied.

16 Claims, 8 Drawing Sheets

Fig.1

| Codeword Label | Input data octet | -ve alphabet codeword | +ve alphabet codeword |
|---|---|---|---|
| D0.0 | 000 00000 | 100111 0100 | 011000 1011 |
| D1.0 | 000 00001 | 011101 0100 | 100010 1011 |
| D2.0 | 000 00010 | 101101 0100 | 010010 1011 |
| D3.0 | 000 00011 | 110001 1011 | 110001 0100 |
| D4.0 | 000 00100 | 110101 0100 | 001010 1011 |
| D5.0 | 000 00101 | 101001 1011 | 101001 0100 |
| D6.0 | 000 00110 | 011001 1011 | 011001 0100 |
| D7.0 | 000 00111 | 111000 1011 | 000111 0100 |
| D8.0 | 000 01000 | 111001 0100 | 000110 1011 |
| D9.0 | 000 01001 | 100101 1011 | 100101 0100 |
| D10.0 | 000 01010 | 010101 1011 | 010101 0100 |
| D11.0 | 000 01011 | 110100 1011 | 110100 0100 |
| D12.0 | 000 01100 | 001101 1011 | 001101 0100 |
| D13.0 | 000 01101 | 101100 1011 | 101100 0100 |
| D14.0 | 000 01110 | 011100 1011 | 011100 0100 |
| D15.0 | 000 01111 | 010111 0100 | 101000 1011 |
| D16.0 | 000 10000 | 011011 0100 | 100100 1011 |
| D17.0 | 000 10001 | 100011 1011 | 100011 0100 |
| D18.0 | 000 10010 | 010011 1011 | 010011 0100 |
| D19.0 | 000 10011 | 110010 1011 | 110010 0100 |
| D20.0 | 000 10100 | 001011 1011 | 001011 0100 |
| D21.0 | 000 10101 | 101010 1011 | 101010 0100 |
| D22.0 | 000 10110 | 011010 1011 | 011010 0100 |
| D23.0 | 000 10111 | 111010 0100 | 000101 1011 |
| D24.0 | 000 11000 | 110011 0100 | 001100 1011 |
| D25.0 | 000 11001 | 100110 1011 | 100110 0100 |
| D26.0 | 000 11010 | 010110 1011 | 010110 0100 |
| D27.0 | 000 11011 | 110110 0100 | 001001 1011 |
| D28.0 | 000 11100 | 001110 1011 | 001110 0100 |
| D29.0 | 000 11101 | 101110 0100 | 010001 1011 |
| D30.0 | 000 11110 | 011110 0100 | 100001 1011 |
| D31.0 | 000 11111 | 101011 0100 | 010100 1011 |

Fig.2

| Codeword Label | Input data octet | -ve alphabet codeword | +ve alphabet codeword |
| --- | --- | --- | --- |
| D0.4 | 100 00000 | 100111 0010 | 011000 1101 |
| D1.4 | 100 00001 | 011101 0010 | 100010 1101 |
| D2.4 | 100 00010 | 101101 0010 | 010010 1101 |
| D3.4 | 100 00011 | 110001 1101 | 110001 0010 |
| D4.4 | 100 00100 | 110101 0010 | 001010 1101 |
| D5.4 | 100 00101 | 101001 1101 | 101001 0010 |
| D6.4 | 100 00110 | 011001 1101 | 011001 0010 |
| D7.4 | 100 00111 | 111000 1101 | 000111 0010 |
| D8.4 | 100 01000 | 111001 0010 | 000110 1101 |
| D9.4 | 100 01001 | 100101 1101 | 100101 0010 |
| D10.4 | 100 01010 | 010101 1101 | 010101 0010 |
| D11.4 | 100 01011 | 110100 1101 | 110100 0010 |
| D12.4 | 100 01100 | 001101 1101 | 001101 0010 |
| D13.4 | 100 01101 | 101100 1101 | 101100 0010 |
| D14.4 | 100 01110 | 011100 1101 | 011100 0010 |
| D15.4 | 100 01111 | 010111 0010 | 101000 1101 |
| D16.4 | 100 10000 | 011011 0010 | 100100 1101 |
| D17.4 | 100 10001 | 100011 1101 | 100011 0010 |
| D18.4 | 100 10010 | 010011 1101 | 010011 0010 |
| D19.4 | 100 10011 | 110010 1101 | 110010 0010 |
| D20.4 | 100 10100 | 001011 1101 | 001011 0010 |
| D21.4 | 100 10101 | 101010 1101 | 101010 0010 |
| D22.4 | 100 10110 | 011010 1101 | 011010 0010 |
| D23.4 | 100 10111 | 111010 0010 | 000101 1101 |
| D24.4 | 100 11000 | 110011 0010 | 001100 1101 |
| D25.4 | 100 11001 | 100110 1101 | 100110 0010 |
| D26.4 | 100 11010 | 010110 1101 | 010110 0010 |
| D27.4 | 100 11011 | 110110 0010 | 001001 1101 |
| D28.4 | 100 11100 | 001110 1101 | 001110 0010 |
| D29.4 | 100 11101 | 101110 0010 | 010001 1101 |
| D30.4 | 100 11110 | 011110 0010 | 100001 1101 |
| D31.4 | 100 11111 | 101011 0010 | 010100 1101 |

Fig.5

| Time period | T7 | T8 | T9 | T10 | T11 | T12 |
|---|---|---|---|---|---|---|
| Control state | 000 00000 | 000 00000 | 000 00000 | 000 00000 | 000 00000 | 000 00000 |
| Multiplexer B O/P | 100 01111 | 100 10011 | 100 00010 | 000 11100 | 100 00000 | 000 00001 |
| Codeword label | D15.4 | D19.4 | D2.4 | D28.0 | D0.4 | D1.0 |
| Multiplexer C O/P: codeword label | D15.4 | D19.4 | D2.4 | K28.5 | D0.4 | D1.0 |
| Multiplexer C O/P | 1010001101 | 1100100010 | 1011010010 | 0011111010 | 0110001101 | 1000101011 |
| RDS of transmitted signal | + | + | − | − | + | + |
| Polarity correction | Off --------------------------------------------------------------------> |
| Received codeword | 0101110010 | 0011011101 | 0100101101 | 1100000101 | 1001110010 | 0111010100 |
| Rec'd codeword label | D15.4 | D12.4 | D2.4 | K28.5 | D0.4 | D1.0 |
| Decoder output | 100 01111 | 100 01100 | 100 00010 | 000 11100 | 100 00000 | 000 00001 |
| Descrambler output | Descrambler synchronisation --------------> |

| Time period | T19 | T20 | T21 | T22 |
|---|---|---|---|---|
| Control state | 000 00000 | 000 00000 | 000 00000 | 000 00000 |
| Multiplexer B O/P | 100 01001 | 000 00100 | 000 11011 | 000 00011 |
| Codeword label | D9.4 | D4.0 | D27.0 | D3.0 |
| Multiplexer C O/P: codeword label | D9.4 | D4.0 | D27.0 | D3.0 |
| Multiplexer C O/P | 1001011101 | 0010101011 | 0010011011 | 1100010100 |
| RDS of transmitted signal | − | + | + | + |
| Polarity correction | On ─────────────────────────────────> | | | |
| Received codeword | 1001011101 | 0010101011 | 0010011011 | 1100010100 |
| Rec'd codeword label | D9.4 | D4.0 | D27.0 | D3.0 |
| Decoder output | 100 10110 | 000 00100 | 000 11011 | 000 11100 |
| Descrambler output | 000 00000 | 000 00000 | 000 00000 | 000 00000 |

TRANSMITTING DATA WORDS

CROSS REFERENCE TO RELATED APPLICATIONS

The present application is a continuation of copending U.S. patent application Ser. No. 09/263,633 filed on Mar. 5, 1999.

TECHNICAL FIELD

This invention relates to methods of encoding data words for transmission, for example via a communications link in a communications network.

BACKGROUND ART

The spread of personal computers and workstations has led to the development of networks for interconnecting such equipment and common resources such as printers and data storage devices. More powerful and sophisticated computing equipment and programs have progressively become available, allowing the processing of data in larger and larger quantities, for example in the form of database information and graphic images. These developments have placed increasing demands on the speed and capacity of network communications links.

For various reasons it has been found desirable to encode data prior to transmission over communications links, in particular:

to ensure that certain minimum error detection capabilities are provided;

to provide uniquely identifiable control signals which can be embedded in the encoded symbol stream;

to assist in maintaining synchronisation of circuit operation (for example by avoiding prolonged sequences of symbols without any signal transition); and to limit undesired electro-magnetic emissions from conductors, and, even in the case of optical systems, from transceivers and chipsets.

It is also usually desirable to avoid significant imbalance or disparity in the occurrence of differently-valued symbols (e.g. positive and negative polarity symbols), to avoid problems of transmission through systems having a.c. coupling, such as through isolating transformers. Various codes have been proposed and adopted which attempt to balance these objectives relative to one another. Many of these proposals involve the use of block codes, in which blocks or words of successive symbols in a data stream are encoded into corresponding blocks or words of code symbols, typically with more symbols in a code word than there are data symbols in the corresponding data word. Another common technique, particularly used for limiting electro-magnetic emissions, is scrambling, in which a pseudo-random symbol sequence is combined with the data stream to limit the occurrence of regular symbol patterns. Block codes and scrambling both impose a requirement for synchronisation between a transmitter and receiver: the receiver must correctly identify the boundaries between successive code words in the received signal stream (alignment), and a de-scrambling process in the receiver must apply a pseudo-random symbol sequence which exactly matches that used in the transmitter's scrambler.

It is an object of this invention to provide methods and apparatus which can be used to facilitate synchronisation between transmitters and receivers in a communications system.

DISCLOSURE OF INVENTION

According to one aspect of this invention there is provided a method of encoding data words for transmission, comprising the steps of:

receiving data words from a source;

scrambling the data words using a scrambling procedure which generates at least one predetermined output pattern with a predetermined probability; and encoding the scrambled data words with a block encoding procedure to produce corresponding code words, different occurrences of the scrambled data word having said predetermined output pattern being selectively encoded with different ones of a plurality of code words associated with that scrambled data word pattern.

According to another aspect of this invention there is provided a method of transmitting first and second data, comprising the steps of:

encoding the first data using a block code for which correct decoding of at least some code words considered as a whole is dependent upon polarity of the code word;

encoding the second data using at least one selected input symbol position in the block code, said symbol position being selected for correct decoding of a symbol at that position to be independent of polarity of the code word;

transmitting said block code words;

decoding said first data in accordance with the values of the block code words considered as a whole; and decoding said second data in accordance with said at least one selected symbol only.

BRIEF DESCRIPTION OF DRAWINGS

Methods and apparatus in accordance with this invention will now be described, by way of example, with reference to the accompanying drawings, in which.

BEST MODE FOR CARRYING OUT THE INVENTION, & INDUSTRIAL APPLICABILITY

There are many examples of serial data communications systems that employ unshielded metallic cables as a transmission medium. One popular type of cable used in Local Area Networks is unshielded twisted pair cable. Radiation of electromagnetic energy from such unshielded cables may cause interference with other electrical equipment, and the level of permissible radiated emission is therefore subject to regulations. As a result, one objective in designing a serial data communications system is to minimise the level of radiation emitted from the cable. In particular, it is desirable to prevent large quantities of the energy of the transmitted signal being concentrated in narrow frequency bands within the available transmission bandwidth, as these spectral peaks are most likely to violate the regulatory limits imposed on radiated emissions.

A stream of data often contains repetitive patterns of data symbols (for example, a repeating pattern in a binary data stream of "1" symbols, or bits, followed by "0" bits). When transmitted, a repetitive data pattern has a frequency spectrum that contains a relatively small number of discrete spectral lines, each containing a relatively large amount of energy. The probability of such repetitive patterns occurring may be reduced significantly by scrambling the data.

There are several known methods of scrambling. In each case it is necessary for a de-scrambling process to be applied to the received information at a receiving node. This process generally involves applying a transformation to the received information, which is an inverse of that applied at the transmitting node during scrambling. In order for this to be successful, scrambler synchronisation must be achieved between the receiver de-scrambling process and the scrambling process in the transmitter.

In a self-synchronous scrambler, the process of de-scrambling data in the receiving node is automatically synchronised to the scrambling process in the transmitting node. In another system, known as a side-stream scrambler, a synchronisation signal must be sent from the transmitting node to the receiving node. In a third system, known as a Distributed Sample Scrambler (DSS), signal samples indicative of the scrambler state are passed from the transmitting node to the receiving node.

A further objective when designing a serial data communications system is to provide a capability for transmitting both data and control information between communicating nodes. A common technique is to use a form of Time Division Multiplexing to transmit control and data information through the same channel, but at different times. In such a scheme it is necessary for a receiving node to be able to distinguish between periods when the received signal represents data and periods when the received signal represents control information. This may be achieved in various ways. For example, both the transmitting and receiving nodes may adhere to a rigid timing scheme in which data and control information are transmitted and received at predetermined times. Alternatively, some form of coding may be used to differentiate data and control signals.

One form of coding that may be used to differentiate data and control information is a block code. A block code encodes m symbols of information as an n-symbol codeword. The n-symbol codewords chosen to encode data information may be different from those chosen to represent control information. In this way the receiving node can distinguish between control and data information. Alternatively, some codewords may be reserved for use as delimiters to distinguish groups of codewords representing data from groups representing control information. An example of such a system is described in International Publication No. WO 97/34 397 (U.S. patent application Ser. No. 08/930,105).

As well as providing distinguishable control and data signals, a block code is generally designed to condition the transmitted signal to suit the transmission medium. For example, when the transmission channel is a.c. coupled (e.g. when transformer coupling is used between nodes and a twisted pair cable), a block code is often designed such that the transmitted sequence of n-symbol codewords has no d.c. content, i.e. the running digital sum (RDS) is on average zero. This may be achieved by using only n-symbol codewords that are in themselves d.c. balanced (e.g. in the binary case they have an equal number of 1 and 0 bits), or by using more than one alphabet of n-symbol codewords and choosing codewords from each alphabet as appropriate to provide a d.c. balanced signal. For example, two alphabets might be used, one containing the complements of the codewords in the other.

A block code is often also designed to aid clock recovery in a receiving node by maximising the rate at which transitions occur in the transmitted signal.

In order to successfully decode an n-symbol codeword, it is necessary for a receiving node to ascertain the correct alignment of codewords within the serial data stream. That is, the receiver must extract n symbols from the data stream which represent one codeword, rather than select n symbols which straddle a concatenation of two codewords. The process by which the receiving node ascertains the correct alignment of codewords is referred to herein as codeword synchronisation.

One known technique for codeword synchronisation involves the use of a "comma" codeword. A comma codeword is a pattern that, by design, is only ever found in one position relative to the codeword boundary within a stream of codewords. The occurrence of a comma codeword may therefore be used to establish the correct alignment of codewords within a received data stream.

As mentioned earlier, serial data communication systems often utilise unshielded metallic cables, such as an unshielded twisted pair. When such a cable is employed balanced signaling is typically used, whereby the signal transmitted on one wire of the pair is equal in magnitude but opposite in polarity to the signal on the other wire. At the receiving node, the signals on the two wires are subtracted from one another. This has the result of magnifying the transmitted signal while minmising the effect of unwanted noise that may be induced in the cable, and which is likely to be similar on both wires.

A common problem encountered in practical installation of systems is that the wires of a twisted pair are incorrectly connected at some point between the transmitting and receiving nodes, such that the polarity of the received signal becomes inverted. Some existing systems allow for such polarity inversion by using a coding scheme that is polarity independent. For example, a simple solution would be for a transmitting node to encode a data 1 as "10" and a data 0 as "00". A receiving node could interpret either "10" or "01" as a data 1, and either "00" or "11" as a data 0, thereby accommodating either polarity. Unfortunately polarity independent codes tend to be inefficient, since for each codeword chosen, its complement cannot be used. An alternative more desirable solution would be for the polarity inversion to be detected when the system is initialised and automatically corrected by inversion of the received signal prior to decoding.

Techniques are described below for achieving codeword and scrambler synchronisation in a serial communications system containing a distributed sample scrambler, in a manner that is polarity independent. These techniques provide a "training" mechanism for synchronising the transmitting and receiving nodes regardless of the polarity of the received signal, for subsequently determining the polarity of the signal, and for then correcting the polarity when necessary. In the event that the polarity needs correction, the system does not require resynchronisation. The techniques described also provide a relatively rapid training process.

The system described uses a distributed sample scrambler, comprising 11-bit generating shift registers in the transmitter and receiver nodes, and an 8B10B block code described in "A DC-balanced, partitioned-block, 8B/10B transmission code" by A. Widmer and P. Franaszek, *IBM J. Res. Develop.*, vol.27, no.5, September 1983, pp. 440–451. With this block code, each 10-bit codeword used to represent an octet of data is commonly referred to as Dx.y where x is the decimal value of the five least significant bits of the octet and y is the decimal value of the three most significant bits of the octet. There are two alphabets of Dx.y codewords which are referred to herein as the positive and negative alphabets. The positive alphabet is used when the RDS is positive and the negative alphabet is used when the RDS is negative.

Figure 1:
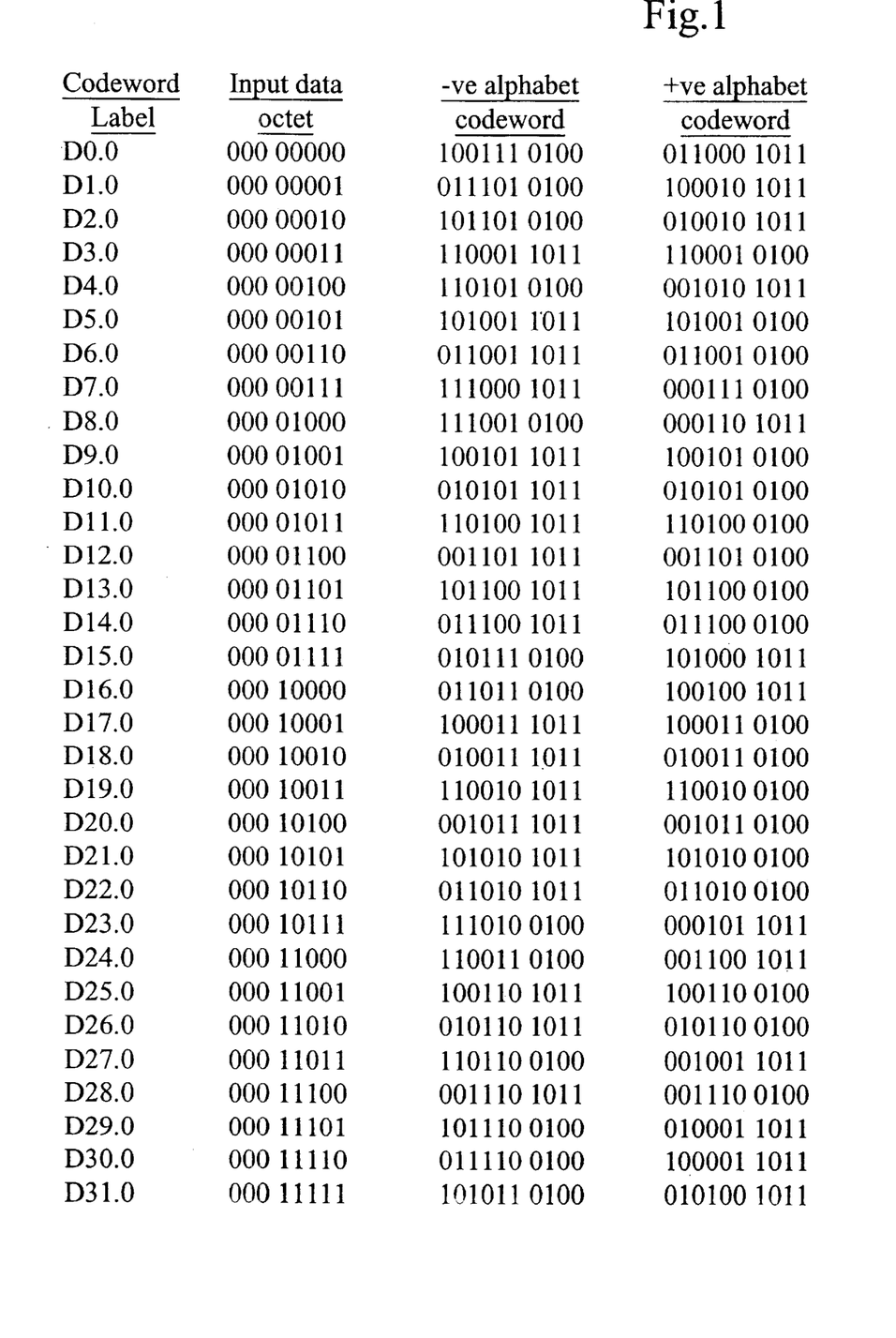
FIGS. 1 and 2 are tables of codewords used in implementing example embodiments of the invention.
Figure 2:
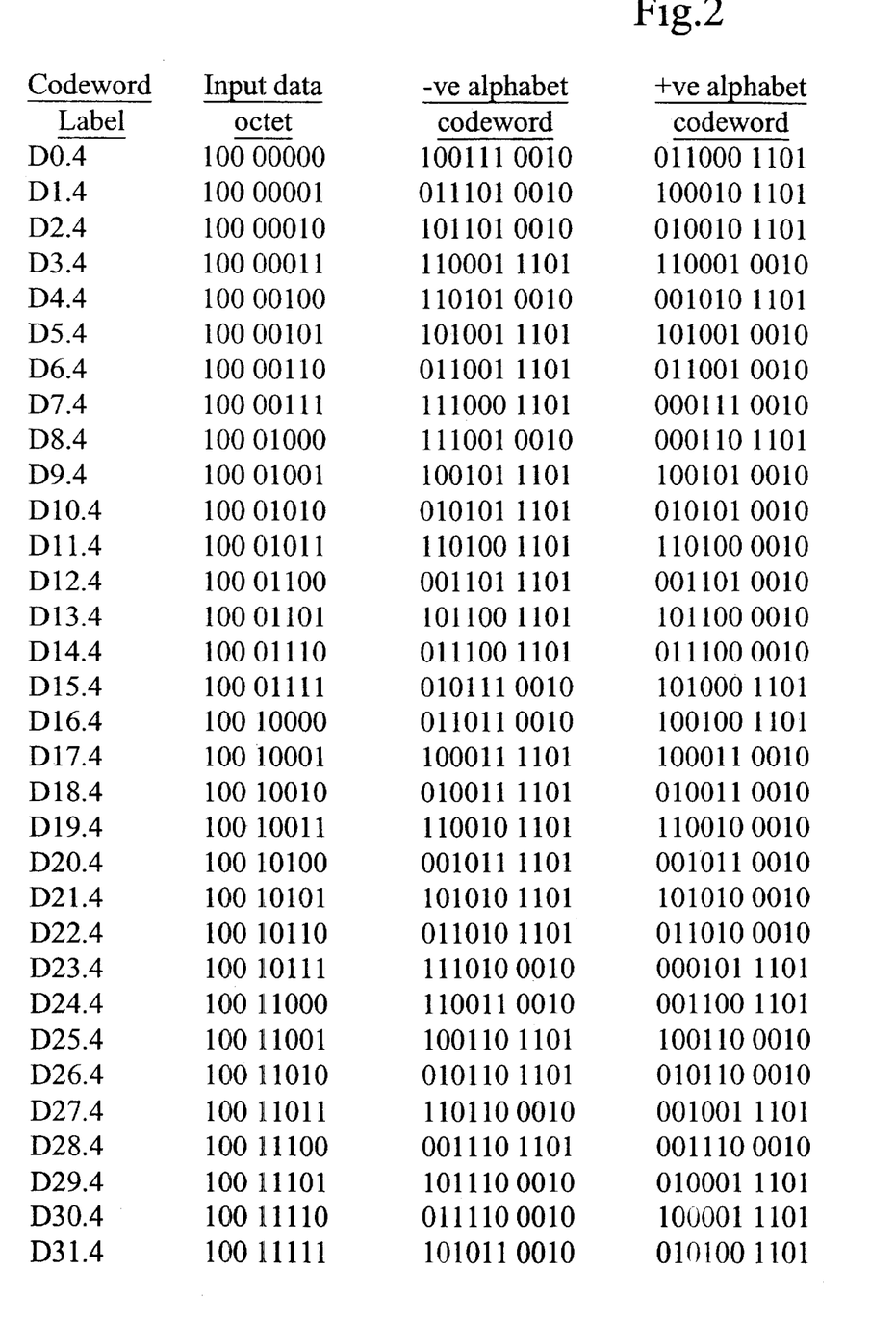

In addition to using the code as described by Widmer and Franaszek for transmitting data, in one aspect of the present invention a subset of 64 of each of these alphabets is used for control signaling, these subsets being the sets of codewords labelled Dx.0 and Dx.4, shown in FIGS. 1 and 2. These two reduced alphabets are used according to the same rules as for data transmission. A set of 16 codewords that are each unique with respect to the data codewords Dx.y are used to represent delimiters between data and control signaling. These 16 codewords are labelled Cz (z=0, 1, 2, . . . 15) and have the following values:

| | |
|---|---|
| C0 | 0000011111 |
| C1 | 0000101111 |
| C2 | 0000111110 |
| C3 | 0001001111 |
| C4 | 0010001111 |
| C5 | 1100000111 |
| C6 | 0100001111 |
| C7 | 1000001111 |
| C8 | 0111110000 |
| C9 | 1011110000 |
| C10 | 0011111000 |
| C11 | 1101110000 |
| C12 | 1110110000 |
| C13 | 1111000001 |
| C14 | 1111010000 |
| C15 | 1111100000 |

The sets of Dx.0 and Dx.4 codewords are all at least partially polarity independent, in that each codeword and its complement are both mapped to data having the same three most significant bits. For example, input data value 000 00011 is coded as codeword D3.0 (positive alphabet). The negative alphabet version of D3.0 is 1100011011. The complement of this codeword, 0011100100, is the positive alphabet codeword for data value D28.0, and so would be decoded as 000 11100. The three most significant bits of this value (000) are identical to those of the original codeword D3.0. (Some of the codewords are totally polarity independent. For example, input data 000 00000 is coded as a D0.0, which has a positive alphabet version that is the complement of its negative alphabet version.)

Since two of these three most significant bits are fixed by the selection of the subsets {Dx.0. Dx,4}, only the most significant bit remains available in this case to carry useful information in a polarity independent manner.

Figure 3:
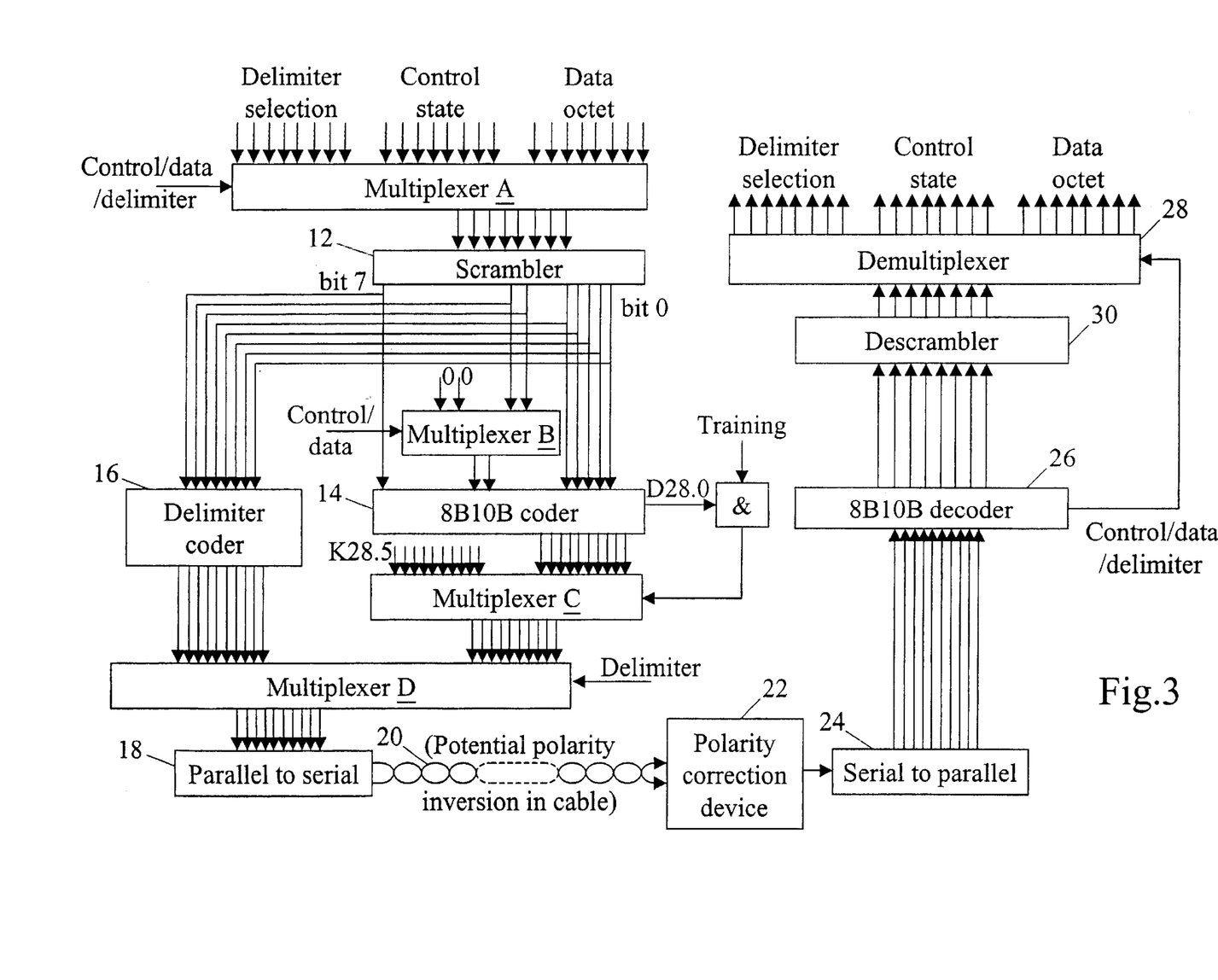
FIG. 3 is a schematic block diagram of encoding and decoding apparatus.

FIG. 3 shows a block diagram of the communications system. Referring to FIG. 3, a multiplexer A is used to select an input signal to a scrambler 12 from among data, control state and delimiter inputs.

The output of the scrambler 12 consists of an 8 bit word. Labelling the most significant bit of the word as bit 7 and the least significant bit as bit 0, bits 6 and 5 are passed to a multiplexer B. All other bits of the scrambler output are passed unmodified to the input of an 8B10B coder 14. When data are being transmitted, the multiplexer B selects bits 6 and 5 of the scrambler output and passes them unmodified to the 8B10B coder input. When a control state is being transmitted, the multiplexer B selects two bits having value 0 and passes them to the input of the 8B10B coder 14. The operation of the multiplexer B thus causes the codeword subsets Dx.0 and Dx.4 to be used for coding control states.

The output of the 8B10B coder 14 is passed to a multiplexer C. The other input to this multiplexer is the "comma" codeword, identified as K28.5. The multiplexer C selects the K28.5 codeword whenever training mode (for synchronisation) is selected and the coder output is simultaneously a D28.0 codeword. Otherwise the multiplexer C selects the output of the 8B10B coder 14.

A multiplexer D selects between the 8B10B coder output and the output of a delimiter coder 16, which selects the appropriate delimiter Cz. The output of the multiplexer D is passed to a parallel to serial converter 18 which is coupled via twisted pair cable 20 to a polarity correction device 22 (a switchable signal inverter) and a serial to parallel converter 24 in the receiver.

In the receiver, the output of the converter 24 is supplied to a decoder 26 which converts each 10-bit codeword to either data, control state or delimiter information, and sets a control input for a demultiplexer 28 accordingly. A de-scrambler 30 between the decoder 26 and the demultiplexer 28 is synchronised with the transmitter scrambler 12 during the training phase.

When the system is initialised (for example after power up or a reset event), an initial set of procedures is followed during the training mode to establish communication between the transmitting and receiving nodes.

The first stage of training is for the receiver to synchronise its clock with that of the transmitting node, for example by recovering clock information from the received signal in known manner. Having recovered a bit clock, the receiving node next achieves codeword synchronisation, and then synchronisation of the distributed sample scrambler 30.

Figure 4:
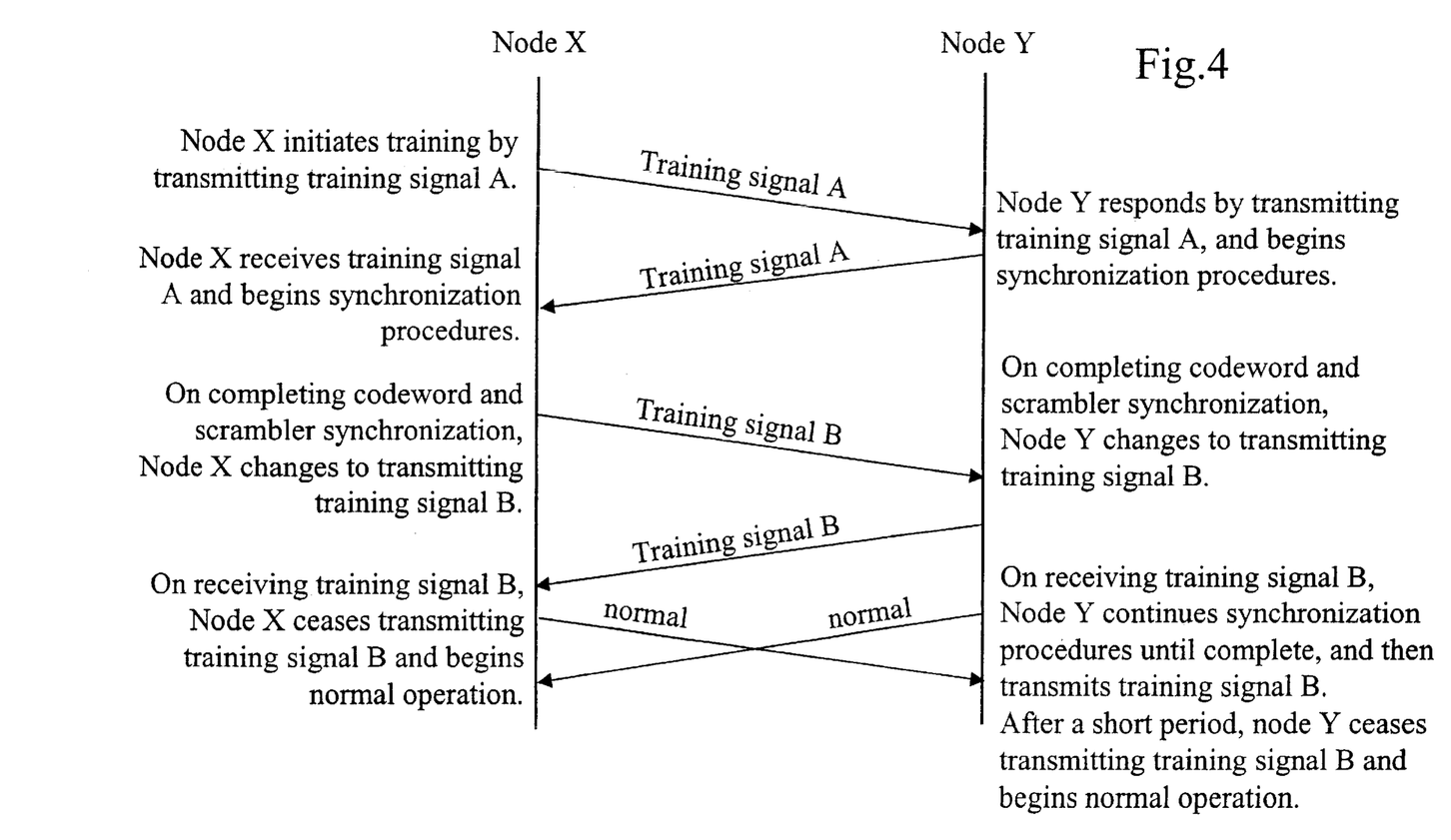
FIG. 4 shows a training signal protocol for synchronising the transmitting and receiving apparatus of FIG. 3.

To facilitate bit, codeword and scrambler synchronisation, a set of training signals are exchanged between the two nodes, X and Y, as shown in FIG. 4. Initially each transmitter sends a training signal A. In the example shown the node X initiates a training phase by sending the training signal A, and the node Y responds when it receives this training signal. As explained below, the training signal A is chosen to have all the properties necessary to allow a receiving node to complete bit, codeword and scrambler synchronisation. Once the first node, X say, has completed synchronisation, it changes the signal it transmits to a training signal B. This indicates to the other node, Y, that the node X has completed synchronisation. The training signal B is also chosen to have all the properties necessary for the node Y to continue synchronisation if not already completed. When the second node Y completes its synchronisation, it also changes its transmitted signal to the training signal B. This in turn indicates to the node X that the node Y has completed synchronisation. When a node determines that it is receiving the training signal B (i.e. its peer node has completed synchronisation) and that it has itself completed synchronisation and transmitted the training signal B for some minimum period, that node exits the training procedure. (Note that the training signal B must be sent for some minimum duration before a node exits training to ensure that the peer node is made aware that the node has completed synchronisation).

An advantage of this technique is that each training signal can be designed to contain all the necessary information for bit, codeword and scrambler synchronisation. This is in contrast to prior systems in which a separate exchange of training signals is necessary for codeword synchronisation and scrambler synchronisation. Since each exchange of signals, or handshake, between nodes incurs a time penalty equal to at least the round trip time over the transmission channel, such other techniques are necessarily slower than the system described here.

The requirements for a training signal which enables effective training, independently of the polarity of received signals, are:

it should satisfy the requirements for radiated emissions;
it should contain a comma codeword so that codeword synchronisation can be achieved;
it should contain samples of the transmitter scrambler state;
it should periodically indicate its status as a training signal; and
the comma and scrambler information should be polarity independent.

In the embodiment described herein, the training signals are a subset of the set of control states i.e. they are each generated by applying a predetermined, constant control state at the input to the transmitter scrambler 12. This control state is scrambled and the result is coded by the block coder 14. In this way the training signals share the properties of all other control signals, being composed of a pseudo-random sequence of control codewords.

To enable insertion of a comma pattern into the training signal, one control codeword which corresponds to a pattern which occurs with predictable probability in the output of the scrambler 12 is chosen for replacement by an alternative comma codeword, the comma codeword by definition being unique with respect to all other codewords. The advantage of this is that the comma pattern is sent frequently but not in a periodic manner, thereby avoiding or at least diminishing the generation of a transmitted signal spectrum containing undesirable spectral peaks. The comma substitution also serves to distinguish a training signal from any other control signal, without a receiving node needing to have first established scrambler synchronisation.

At the receiving node, the comma codeword is used to achieve codeword synchronisation, and decoded to give the same result as the replaced codeword.

This technique is not limited to the substitution of a single codeword by a comma codeword. Several comma codewords may each be used to replace particular codewords, provided a one-to-one mapping is maintained between the comma codewords and the substituted codewords. The use of several comma codewords may serve to reduce the period required for comma detection.

For codeword synchronisation to succeed independently of the polarity of the received signal, any comma codeword used should be chosen such that its complement also has the property of being a comma, i.e. it can only ever be found in one position relative to the codeword boundary in a stream of codewords.

A further enhancement may be made by ensuring that the complement of any comma codeword used for substitution is not only a comma itself, but is also unique with respect to any other comma codeword that has been used. This property allows a receiving node to not only achieve codeword synchronisation independently of polarity, but also to determine that polarity inversion of the received signal has occurred when such a complemented comma codeword is received.

With many practical block codes, the number of comma codewords available is very limited (perhaps to only one or two). In such cases, although it is possible to achieve polarity-independent codeword synchronisation, it may not be possible, or it may require an unacceptably latency, to achieve polarity detection in the manner described above. It is therefore desirable that the system be able to proceed with scrambler synchronisation in a polarity independent manner, and subsequently correct the polarity if necessary.

In the case of a distributed sample scrambler a mechanism is needed to transmit samples of the scrambler state to the receiving node in order for that node to train its de-scrambler 30. For this training to be successful independently of the polarity of the received signal, the scrambler samples must be transmitted in a manner that is independent of polarity. This could be achieved through the use of a polarity-independent block code. However, these tend to make inefficient use of transmission bandwidth.

Since the scrambler state need only be sampled periodically, then the samples may be transmitted in a polarity independent manner provided some portion (though not necessarily all) of the information capacity of the channel is polarity independent. One way in which this may be achieved is by making the codeword set used for transmitting scrambler samples partially polarity independent.

The manner in which a codeword and its complement may be used to represent the same information as part of two distinct alphabets has been described above with reference to FIGS. 1 and 2, for the purposes of d.c. balance control. For such codewords, the information represented by each codeword is essentially transmitted in a polarity independent fashion. However, in other cases, the complement of a particular codeword may be used to represent other information than that represented by the codeword itself. For example, the complements of codewords that contain an equal number of ones and zeros can be used to represent other information than that for which the codeword itself is used, since the complement cannot be used to control d.c. balance.

In the present system a partially polarity independent coding scheme is constructed by ensuring that codewords are mapped to information input to the multiplexer A such that any particular codeword and its complement represent information that has at least some subset of $l$ ($1<l<m$) bits in common. In this way, information represented by any of the $l$ polarity-independent bits will be correctly decoded independently of the received signal polarity. By transmitting samples of the scrambler state using one or more of those $l$ bits that have polarity independence, scrambler synchronisation can be achieved regardless of the received signal polarity.

Once scrambler synchronisation has been achieved, the only impediment remaining to successful information transfer is the possibility of polarity inversion. This can now be detected in a receiving node simply by checking that the received control state is indeed one of the anticipated training states. To this end, it is advantageous for the training state information to be represented by at least some of the bits that are not polarity independent. Should the receiver decode and de-scramble a control state other than the anticipated training control states, then it may determine that a polarity inversion has occurred. This technique has the advantage that the polarity inversion may be corrected at the receiver input without the need for the training procedure to be repeated.

In the embodiment shown in FIG. 3, the training control states are chosen such that the most significant bit (bit 7) of the control state input to the multiplexer A is constant and in this case (arbitrarily) zero. Thus after scrambling, by virtue of the intrinsic operation of the scrambler 12, the most significant bit of the scrambled training control state is equal to the corresponding bit of the current scrambler state. One out of every eight scrambler state bits is therefore transmitted to the receiving node in a polarity independent manner.

At the output of the 8B10B coder 14 in the transmitting node, each occurrence of a D28.0 codeword (see FIG. 1) is replaced with a comma codeword by the multiplexer C whenever a training signal is being transmitted. The pattern coded as the D28.0 codeword can be shown to occur in the output of the scrambler 12 with sufficient probability to enable effective use of the replacement comma codeword for codeword synchronization. The comma codewords used are those described in the article by Widmer and Franaszek referenced above, and are labelled K28.5. A positive and a negative alphabet version of this comma codeword exist, and these are used to replace the positive and negative alphabet versions of the D28.0 codeword respectively.

At the receiver, the reception of the K28.5 comma codeword is used to achieve codeword synchronization in the serial-to-parallel converter 24, i.e. determine the location in the incoming bit stream of boundaries between successive 10-bit codewords to be supplied by the serial-to-parallel converter to the 8B10B decoder 26. The comma codewords do not provide polarity detection, as the positive and negative alphabet versions of K28.5 are complementary.

With this arrangement it is possible that a spurious comma codeword might be generated by the concatenation of Dx.y codewords with Cz codewords, for example whenever a Cz codeword is used to delimit the start or end of a packet. This could lead to incorrect codeword synchronization when a receiving node has entered a training state but its peer node is still transmitting packets. This is plausible since there will be some delay between node A's initiating training, by generating a training signal, and node B's responding with its training signal. However, we have found that should such an erroneous comma codeword be generated and used as a reference during codeword synchronisation, then it is impossible for the preceding two codewords to be valid members of the set of Dx.0, Dx.4 codewords. Therefore the codeword synchronization process in this example is conditional upon not only receiving a comma codeword, but also upon that comma codeword being preceded by two consecutive valid Dx.0 or Dx.4 codewords.

Once codeword synchronization is accomplished, the most significant bits of the successive decoded octets are used to train the de-scrambler 30. For an 11-bit scrambler shift register, 11 samples are required to complete scrambler synchronization. Once the de-scrambler is synchronized, the de-scrambled control state should equal one of the predetermined training control states. If polarity inversion has occurred, then the five least significant bits of the received control signal will either be unaffected or will be inverted, depending upon the particular codeword that was used to represent that control signal. Since the scrambling process causes a pseudo-random selection of Dx.0 and Dx.4 codewords to be used, the least significant 5 bits of the control signal will at some point be inverted if a polarity inversion exists. This inversion can be used to detect the polarity inversion and control corrective action.

FIGS. 5 to 8 illustrate the signal values at various points in the transmitter and receiver during the training phase, in the case where a polarity inversion has occurred along the cable 20 between the transmitter and receiver. Each column in these figures represents a time period T1 to T22 of length equal to the time taken to transmit a single octet of data; the kth data octet or control state is transmitted during time period Tk. For the sake of clarity, it is assumed that the propagation delay experienced by signals passing through the transmitter, the cable and receiver is zero. In practice there would of course be some delay associated with each of these elements of the system.

In this example a training signal is transmitted which has control state value 000 00000. During the training phase the multiplexer B selects two 0 bits to replace bits 6 and 5 of the scrambler output.

Figure 5:
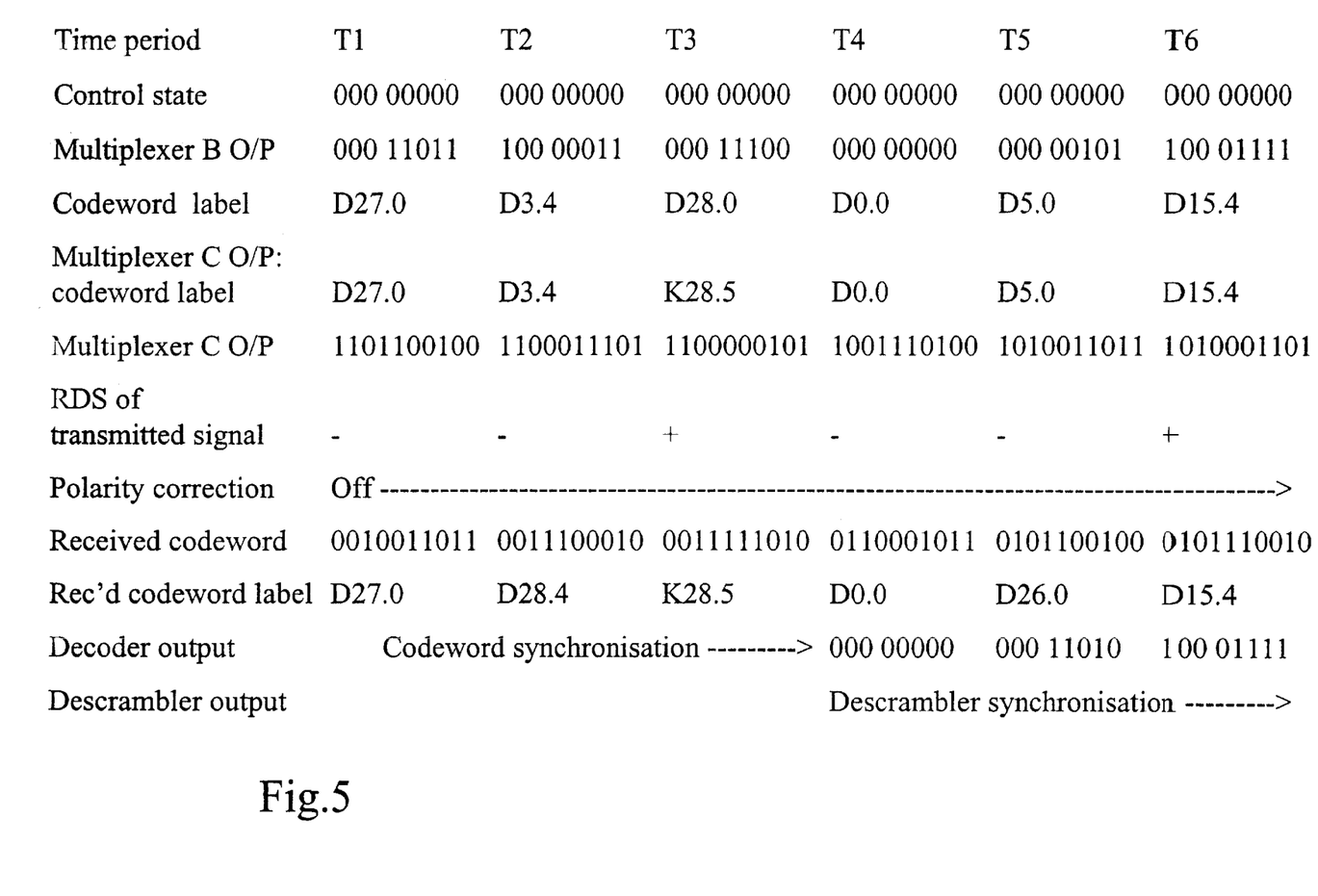
FIGS. 5 to 8 are timing diagrams showing signal values at various points in the transmitting and receiving apparatus of FIG. 3.

At time period T3 an example of comma codeword substitution is shown. The output of the multiplexer B is 000 11100, which is coded as a D28.0 codeword. The occurrence of this codeword during training causes the multiplexer B to replace the D28.0 codeword with a K28.5 codeword. Because the running digital sum at the start of time period T3 is positive, the positive alphabet version of the codeword K28.5 is transmitted. (In this example, the output of the multiplexer D is always equal to the output of the multiplexer C.)

After polarity inversion in the cable 20, the K28.5 codeword at time period T3 becomes the negative alphabet version of K28.5. This is also a comma codeword, and so at the end of time period T3 the receiver nonetheless achieves codeword synchronisation.

Figure 6:
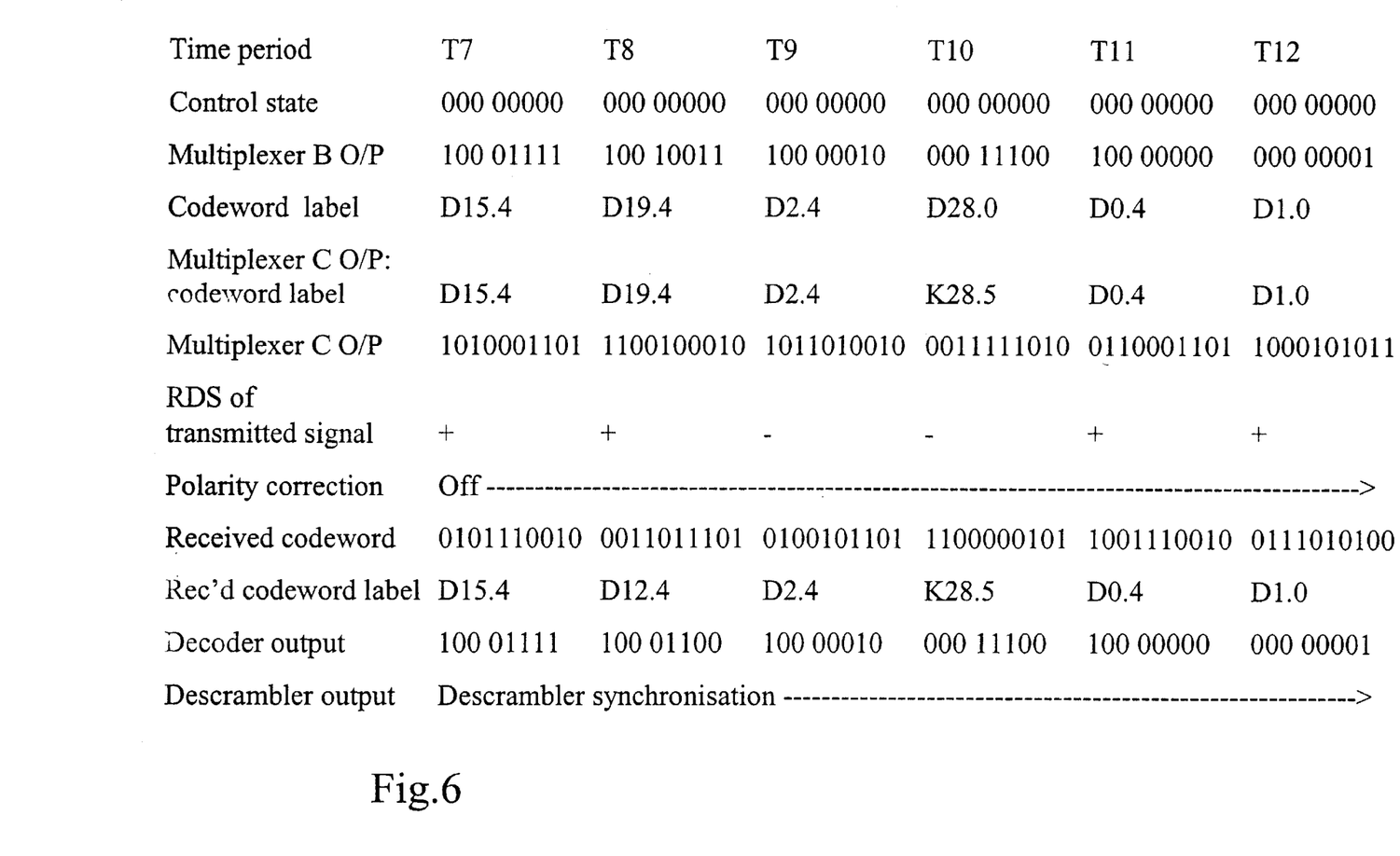
Figure 7:
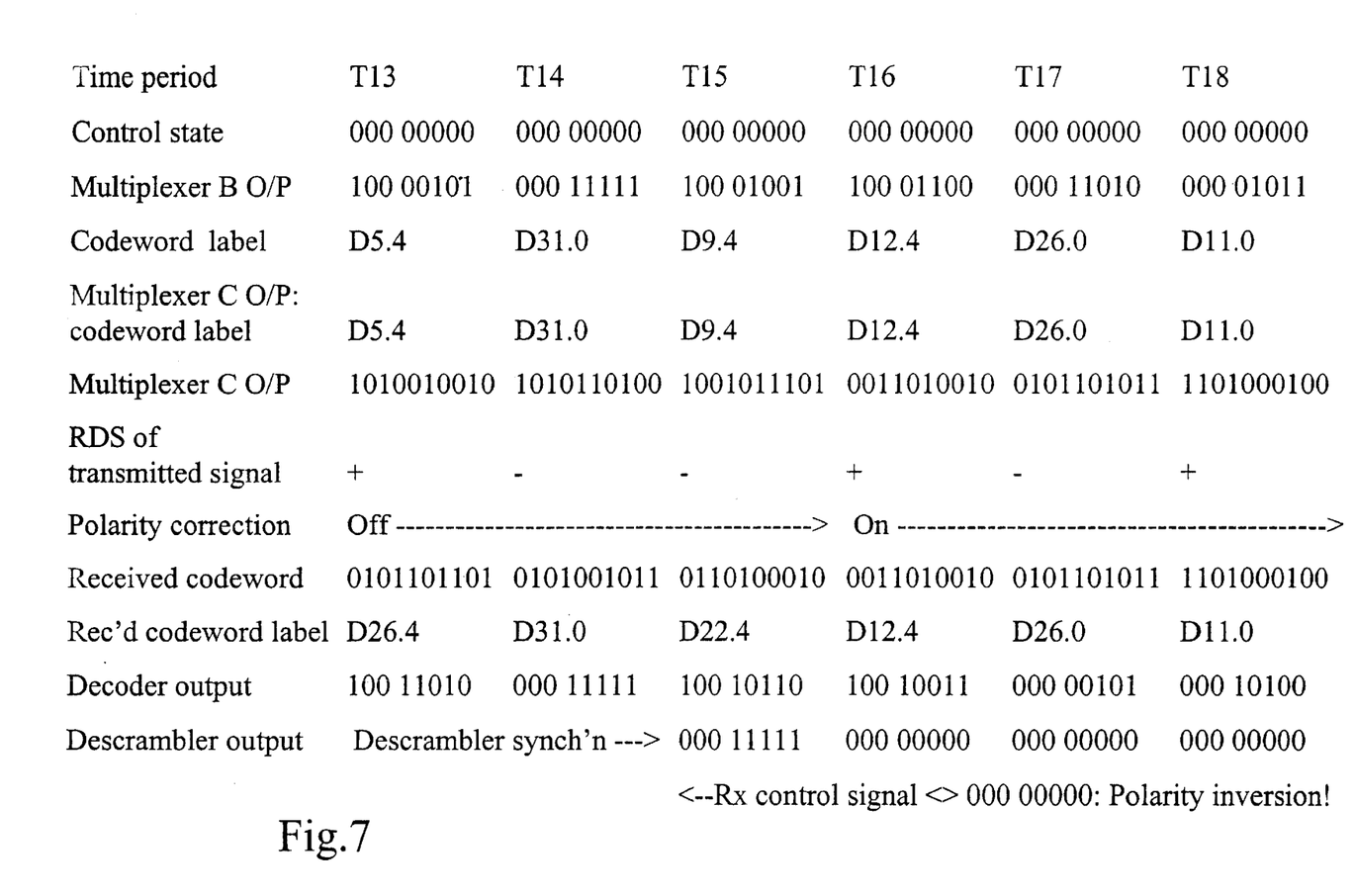

During time periods T4 to T14 the receiver receives polarity-inverted codewords. However, in each case the most significant bit of the decoded codeword is equal to the most significant bit output by the transmitter scrambler 12, owing to the partially polarity independent nature of the control state coding. The receiver is therefore able to synchronise its de-scrambler 30 with the transmitter scrambler 12. This process requires 11 time periods (since 11 samples of the transmitter scrambler state are required).

Figure 8:
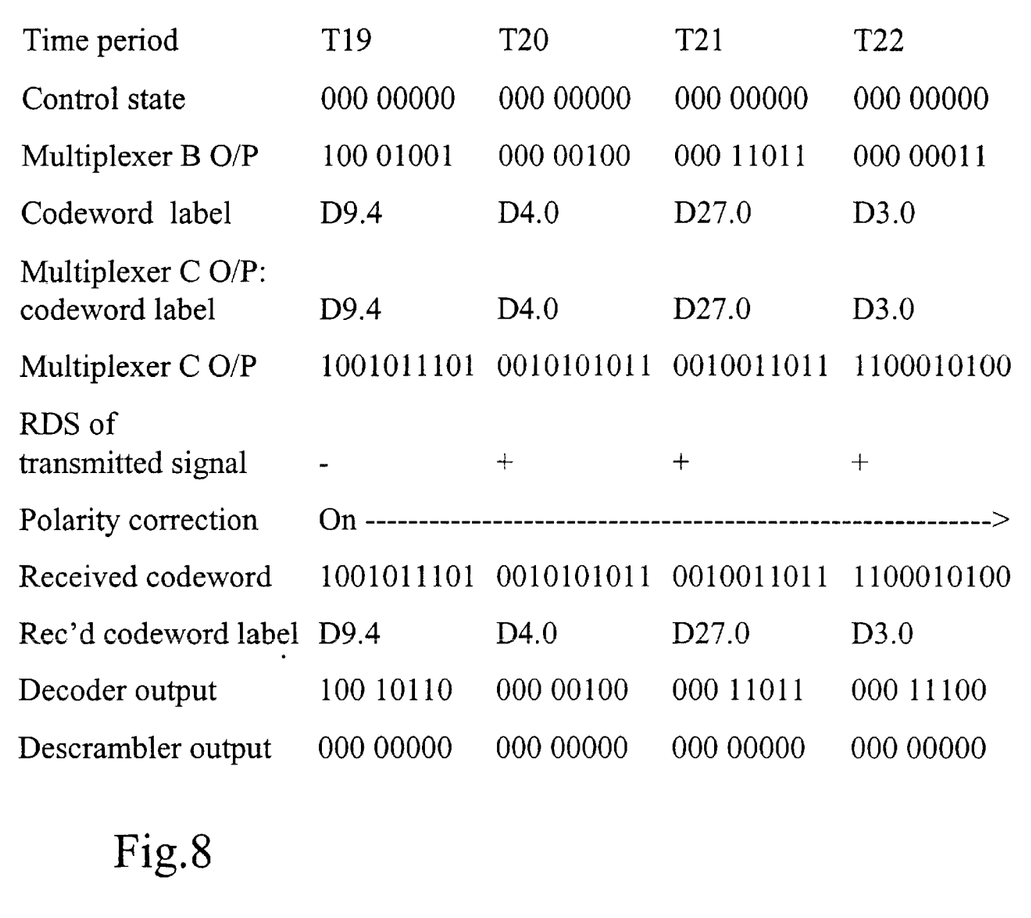

At the end of time period T14, the receiver de-scrambler is synchronised, and the receiver is able to examine the de-scrambled control state. Owing to polarity inversion between the transmitter and receiver, the received control state is 000 11111, at time period T15. This indicates that the polarity of the received signal is inverted, and the receiver can use this information to correct the polarity inversion in the correction device 22.

Various modifications are possible to the system described above and shown in the drawings. For example, instead of having the 8B10B coder 14 supplying the multiplexer C, this multiplexer could receive the outputs of the scrambler 12 and the multiplexer B directly and select between two coders, one like the coder 14 for the normal 8B10B code and the other for this code but with the K28.5 codeword substituted for the D28.0 codeword.

What is claimed is:

1. A method of encoding data words, comprising:
   receiving data words from a source;
   scrambling the data words using a scrambling procedure which generates at least one predetermined output pattern with a predetermined probability; and
   encoding the scrambled data words with a block encoding procedure to produce corresponding code words, different occurrences of the scrambled data word having said predetermined output pattern being selectively encoded with different ones of a plurality of code words associated with that scrambled data word pattern.

2. The method of claim 1, wherein the scrambling procedure generates a plurality of predetermined output patterns with a predetermined probability, and each of said output patterns has associated with it a respective plurality of different code words.

3. The method of claim 1, wherein each of said plurality of code words associated with the scrambled data pattern is unique with respect to code words associated with output patterns generated by the scrambling procedure other than said predetermined output pattern.

4. A method of encoding data words, comprising:
   receiving data words from a source;
   scrambling the data words to generate scrambled data words such that a particular scrambled data word is periodically generated with a predetermined probability; and encoding the scrambled data words to generate codewords, such that a first occurrence of said particular scrambled data word is encoded as a first codeword and a second occurrence of said particular scrambled data word is encoded as a second codeword, wherein said second codeword is different from said first codeword.

5. The method of claim 4, wherein said scrambling generates a plurality of particular output patterns with a predetermined probability, and each of said plurality of particular output patterns has associated with it a respective plurality of different codewords.

6. The method of claim 4, wherein said scrambling generates a first output pattern with a first predetermined probability and a second output pattern with a second predetermined probability, and wherein said second predetermined probability is different from said first predetermined probability.

7. The method of claim 4, wherein each of said first and second codewords is unique with respect to all others of said codewords generated by said encoding.

8. A method of encoding data words, comprising:

receiving data words from a source;

scrambling the data words to generate scrambled data words such that a particular scrambled data word is periodically generated with a predetermined probability; and encoding the scrambled data words to generate codewords, wherein said encoding selects (a) a first block code that generates a first codeword for said particular scrambled data word, or (b) a second block code that generates a second codeword for said particular scrambled data word, and wherein said second codeword is different from said first codeword.

9. The method of claim 8, wherein said first and second codewords are unique with respect to all others of said codewords generated by said first and second block codes.

10. The method of claim 9, wherein said first and second codewords are unique with respect to complements of all others of said codewords generated by said first and second block codes.

11. The method of claim 8, wherein each of said first and second block codes comprises a plurality of alphabets of codewords.

12. The method of claim 8, wherein said first codeword comprises a pattern of symbols that occurs at only one position relative to a codeword boundary within a stream of codewords generated by said encoding.

13. The method of claim 12, wherein said first codeword comprises a pattern of symbols that occurs at only one position relative to a codeword boundary within the complement of a stream of codewords generated by said encoding.

14. The method of claim 8, wherein said encoding selects said first block code to indicate that synchronization information related to said scrambling is encoded in said generated codewords.

15. The method of claim 8, wherein said scrambled data words are 8-bit words and said codewords are 10 bit words.

16. The method of claim 8, wherein said scrambling is performed by a distributed sample scrambler.

* * * * *